United States Patent
Jia et al.

(10) Patent No.: US 9,130,530 B2
(45) Date of Patent: Sep. 8, 2015

(54) GAIN SYNCHRONIZATION CIRCUITRY FOR SYNCHRONIZING A GAIN RESPONSE BETWEEN OUTPUT STAGES IN A MULTI-STAGE RF POWER AMPLIFIER

(71) Applicant: RF Micro Devices, Inc., Greensboro, NC (US)

(72) Inventors: Bin Jia, Xi'an (CN); Yuan Wei, Shanghai (CN); William Lam, Oak Ridge, NC (US)

(73) Assignee: RF Micro Devices, Inc., Greensboro, NC (US)

(*) Notice: Subject to any disclaimer, the term of this patent is extended or adjusted under 35 U.S.C. 154(b) by 130 days.

(21) Appl. No.: 14/043,294

(22) Filed: Oct. 1, 2013

(65) Prior Publication Data

US 2014/0220910 A1 Aug. 7, 2014

Related U.S. Application Data

(60) Provisional application No. 61/759,795, filed on Feb. 1, 2013.

(51) Int. Cl.
  *H01Q 11/12* (2006.01)
  *H04B 1/04* (2006.01)
  *H03G 3/30* (2006.01)
  *H03F 3/72* (2006.01)

(52) U.S. Cl.
  CPC ............ *H03G 3/3042* (2013.01); *H03F 3/72* (2013.01); *H04B 1/0458* (2013.01)

(58) Field of Classification Search
  USPC ............ 455/127.1–127.4, 522, 115.1, 115.3, 455/115.4; 330/250, 278, 295, 124 R, 133
  See application file for complete search history.

(56) References Cited

U.S. PATENT DOCUMENTS

| | | | |
|---|---|---|---|
| 6,288,606 B1 * | 9/2001 | Ekman et al. | 330/51 |
| 7,038,541 B2 * | 5/2006 | Hamparian | 330/151 |
| 7,054,597 B2 * | 5/2006 | Rosnell | 455/110 |
| 7,091,792 B2 * | 8/2006 | Mehr | 330/305 |
| 7,254,377 B2 * | 8/2007 | Maruyama et al. | 455/127.3 |
| 7,382,186 B2 * | 6/2008 | Apel et al. | 330/129 |
| 7,385,445 B2 * | 6/2008 | Wright | 330/51 |
| 7,408,405 B2 * | 8/2008 | Ohnishi et al. | 330/51 |
| 7,554,394 B2 * | 6/2009 | Maemura | 330/124 R |
| 7,925,227 B2 * | 4/2011 | Ichitsubo | 455/114.1 |
| 8,154,432 B2 * | 4/2012 | Kaper et al. | 341/120 |
| 8,248,160 B2 * | 8/2012 | Saed | 330/149 |
| 8,362,837 B2 * | 1/2013 | Koren et al. | 330/295 |
| 8,774,742 B2 * | 7/2014 | Asuri et al. | 455/127.5 |
| 8,874,051 B2 * | 10/2014 | Rozenblit et al. | 455/127.1 |
| 8,897,730 B2 * | 11/2014 | Zhao | 455/127.4 |

* cited by examiner

*Primary Examiner* — Tuan A Tran
(74) *Attorney, Agent, or Firm* — Withrow & Terranova, P.L.L.C.

(57) ABSTRACT

A multi-stage radio frequency (RF) power amplifier includes a high-power amplifier path and a low-power amplifier path. The low-power amplifier path includes gain synchronization circuitry in order to synchronize the gain response of the high-power amplifier path and the low-power amplifier path. By synchronizing the gain response of the high-power amplifier path and the low-power amplifier path, the gain linearity of the multi-stage RF amplifier is improved.

24 Claims, 8 Drawing Sheets

GAIN SYNCHRONIZATION CIRCUITRY FOR SYNCHRONIZING A GAIN RESPONSE BETWEEN OUTPUT STAGES IN A MULTI-STAGE RF POWER AMPLIFIER

RELATED APPLICATIONS

This application claims the benefit of U.S. provisional patent application Ser. No. 61/759,795, filed Feb. 1, 2013, the disclosure of which is incorporated herein by reference in its entirety.

FIELD OF THE INVENTION

The present disclosure relates to radio frequency (RF) power amplifier circuitry for use in a mobile terminal. Specifically, the present disclosure relates to gain synchronization circuitry for synchronizing a gain response between output stages in a multi-stage RF power amplifier.

BACKGROUND

Radio frequency (RF) power amplifiers are often used in the front end circuitry of a mobile device for amplifying baseband signals to appropriate levels for transmission from an antenna. Due to the evolution of wireless communication standards as well as the demand for smaller, more efficient mobile devices, the complexity of RF power amplifiers continues to increase. Modern front end circuitry may include RF power amplifiers with multiple gain stages in order to increase the efficiency of a mobile device. Each gain stage may be configured to transmit a signal at a given power. While the use of multi-stage RF power amplifiers has a positive impact on the efficiency of front end circuitry in which it is incorporated, the multi-stage approach often results in a non-continuous gain response of an RF power amplifier. Discontinuities in the gain response of an RF power amplifier may cause the RF power amplifier to fail to meet one or more standards requirements, such that the device may not be incorporated into a mobile device suitable for distribution or sale.

FIG. 1 shows a conventional transmit chain 10 for a mobile terminal. The conventional transmit chain 10 includes transceiver circuitry 12, one or more RF power amplifiers 14A-14N (referred to collectively as the RF power amplifiers 14), antenna switching circuitry 16, control circuitry 18, and an antenna 20. Each one of the RF power amplifiers 14 is coupled between the transceiver circuitry 12 and the antenna switching circuitry 16. The antenna 20 is coupled to the antenna switching circuitry 16, such that the antenna switching circuitry 16 is used to select one of the RF power amplifiers 14 to couple to the antenna 20. The control circuitry 18 is coupled to the transceiver circuitry 12, each one of the RF power amplifiers 14, and the antenna switching circuitry 16.

In operation, the transceiver circuitry 12 receives digitized data, which may represent voice, data, or control information. The digitized data is modulated to produce a carrier signal at a desired transmit frequency. The carrier signal is then delivered to one or more of the RF power amplifiers 14, where it is amplified and delivered to the antenna switching circuitry 16. The antenna switching circuitry 16 selectively couples one or more output terminals of the RF power amplifiers 14 to the antenna 20 in order to transmit the carrier signal. The control circuitry 18 may control one or more operating parameters of the transceiver circuitry 12, the RF power amplifiers 14, and the antenna switching circuitry 16.

FIG. 2 shows details of the first RF power amplifier 14A in the conventional transmit chain 10. For context, the control circuitry 18 is also shown. The first RF power amplifier 14A is a multi-stage RF power amplifier including a first gain stage 22, a second gain stage 24, and a third gain stage 26. The first gain stage 22, the second gain stage 24, and the third gain stage 26 are bipolar junction transistors (BJTs) including a collector terminal C, an emitter terminal E, and a base terminal B. The base terminal B of the first gain stage 22 is coupled to an input terminal 28 through a first coupling capacitor 30. The collector terminal C of the first gain stage 22 is coupled to the base terminal B of the second gain stage 24 through a second coupling capacitor 32. The emitter terminal E of the first gain stage 22 is coupled to ground.

The collector terminal C of the second gain stage 24 is coupled to the base terminal B of the third gain stage 26 through a third coupling capacitor 34, and also to a low-power amplifier path 36 through a fourth coupling capacitor 38. The emitter terminal E of the second gain stage 24 is coupled to ground. The collector terminal C of the third gain stage 26 is coupled to a high-power amplifier path 40. A supply voltage VDD is provided to the collector terminal C of each one of the first gain stage 22, the second gain stage 24, and the third gain stage 26 through a first choke inductor 42A, a second choke inductor 42B, and a third choke inductor 42C, respectively. First gain stage bias circuitry 44 is coupled to the base terminal B of the first gain stage 22 and the second gain stage 24. Second gain stage bias circuitry 46 is coupled to the base terminal B of the third gain stage 26. The low-power amplifier path 36 includes low-power matching circuitry 48. The high-power amplifier path 40 includes high-power matching circuitry 50. The control circuitry 18 is coupled to the first gain stage bias circuitry 44, the second gain stage bias circuitry 46, and the low-power matching circuitry 48.

In operation, the first RF power amplifier 14A receives a signal at the input terminal 28 from the transceiver circuitry 12 (FIG. 1). The signal is passed through the first coupling capacitor 30 to the base terminal B of the first gain stage 22, where it is amplified and presented at the collector terminal C of the first gain stage 22. The amplified signal is then passed through the second coupling capacitor 32 to the base terminal B of the second gain stage 24, where it is further amplified and presented at the collector terminal C of the second gain stage 24. When the first RF power amplifier 14A is in a low-power mode of operation, the amplified signal is delivered to the low-power amplifier path 36 through the fourth coupling capacitor 38. The signal is then passed through a low-power bypass switch 52 to the low-power matching circuitry 48, and subsequently delivered to an output terminal 54 through a low-power output switch 56. When the first RF power amplifier 14A is in a high-power mode of operation, the amplified signal is delivered to the base terminal B of the third gain stage 26, where it is further amplified and presented at the collector terminal C of the third gain stage 26. The amplified signal is then delivered to the output terminal 54 through the high-power matching circuitry 50 and a high-power output switch 58 in the high-power amplifier path 40.

The control circuitry 18 may control one or more operating parameters of the first gain stage bias circuitry 44, the second gain stage bias circuitry 46, the low-power bypass switch 52, the low-power output switch 56, and the high-power output switch 58. In the low-power mode of operation of the first RF power amplifier 14A, the control circuitry 18 may operate the first gain stage bias circuitry 44 such that the first gain stage 22 and the second gain stage 24 are placed in an active, or ON state, and operate the second gain stage bias circuitry 46 such that the third gain stage 26 is placed in an OFF state. Further, in the low-power mode of operation, the control circuitry 18 may close the low-power bypass switch 52, close the low power output switch 56, and open the high-power output switch 58 in order to direct the amplified signal to the output terminal 54 through the low-power amplifier path 36.

In the high-power mode of operation of the first RF power amplifier 14A, the control circuitry 18 may operate the first gain stage bias circuitry 44 and the second gain stage bias circuitry 46 such that the first gain stage 22, the second gain stage 24, and the third gain stage 26 are placed in an active, or ON state. Further, in the high-power mode of operation, the control circuitry 18 may open the low-power bypass switch 52 and the low-power output switch 56 while closing the high-power output switch 58 to direct the amplified signal to the output terminal 54 through the high-power amplifier path 40.

The low-power matching circuitry 48 and the high-power matching circuitry 50 may include active or passive components adapted to match an impedance at the output of the collector terminal C of the second gain stage 24 and the third gain stage 26, respectively, to an impedance presented at the output terminal 54.

Depending on the desired output power of a mobile terminal in which the first RF power amplifier 14A is incorporated, either the low-power mode of operation or the high-power mode operation of the first RF power amplifier 14A is chosen. In order to comply with one or more mobile standards, a fixed gain delta is desired between low-power mode and high-power mode.

In either the low-power mode of operation or the high-power of operation, the load presented at the antenna 54 may deviate from the designed load of 50Ω, thereby changing the overall gain of RF power amplifier 14A. As will be appreciated by those of ordinary skill in the art, when the RF power amplifier 14A is switched between its respective modes of operation, the load lines of the second gain stage 24 operating in the low-power mode and the third gain stage 26 operating in the high-power mode will differ, resulting in a non-continuous gain response of the first RF power amplifier 14A at the switching point of the low-power mode of operation and the high-power mode of operation. This non-continuous gain response may cause the first RF power amplifier 14A to fail to meet standards requirements across a full dynamic range of desired output power at the vicinity of the low-power mode and high-power mode switching point, such that the device cannot be incorporated into a mobile terminal suitable for distribution or sale.

FIG. 3 shows a chart depicting the non-continuous gain response of the first RF power amplifier 14A. The gain of the first RF power amplifier 14A in the high-power mode of operation with respect to the phase of a load attached to the output terminal 54 is shown by a solid line 60. The gain of the first RF power amplifier 14A in the low-power mode of operation with respect to the phase of a load attached to the output terminal 54 is shown by a dashed line 62. Finally, the gain delta, or difference in the gain response of the first RF power amplifier 14A in the high-power mode of operation and the low-power mode of operation, is shown by a semi-solid line 64. As seen in FIG. 3, the gain response of the first RF power amplifier 14A in the high-power mode of operation is shifted in phase from the gain response of the first RF power amplifier 14A in the low-power mode of operation, causing a maximum gain delta of around 1.5 dB. Accordingly, switching between the high-power mode of operation and low-power mode of operation will cause a non-continuous gain response of the first RF power amplifier 14A.

As discussed above, discontinuities in the gain response of the first RF power amplifier 14A may cause the first RF power amplifier 14A to fail to meet standards requirements, such that the device cannot be incorporated into a mobile terminal suitable for distribution or sale. Accordingly, multi-stage RF amplifier circuitry is needed that is capable of producing a continuous gain response over a variety of load phase conditions.

SUMMARY

A multi-stage radio frequency (RF) power amplifier includes a high-power amplifier path and a low-power amplifier path. The low-power amplifier path includes gain synchronization circuitry in order to synchronize the gain response of the high-power amplifier path and the low-power amplifier path. By synchronizing the gain response of the high-power amplifier path and the low-power amplifier path, the continuity of the gain response of the multi-stage RF amplifier is improved.

According to one embodiment, the multi-stage RF power amplifier includes a first gain stage, a second gain stage coupled in series at an output of the first gain stage, and a third gain stage coupled in series at an output of the second gain stage. The low-power amplifier path is coupled to the output of the second gain stage. The high-power amplifier path is coupled to an output of the third gain stage. In a high-power mode of operation of the multi-stage RF power amplifier, the first gain stage, the second gain stage, and the third gain stage are active, and a signal placed at the input of the multi-stage RF power amplifier is delivered through each one of the gain stages to the high-power amplifier path. In a low-power mode of operation, the third gain stage is disabled, while the first gain stage and the second gain stage are active. In the low-power mode of operation, a signal placed at the input of the multi-stage RF power amplifier is delivered to the low-power amplifier path through the gain synchronization circuitry. The gain synchronization circuitry synchronizes the gain response of the multi-stage power amplifier in the low-power mode and the high-power mode in order to improve the continuity of the gain response of the device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
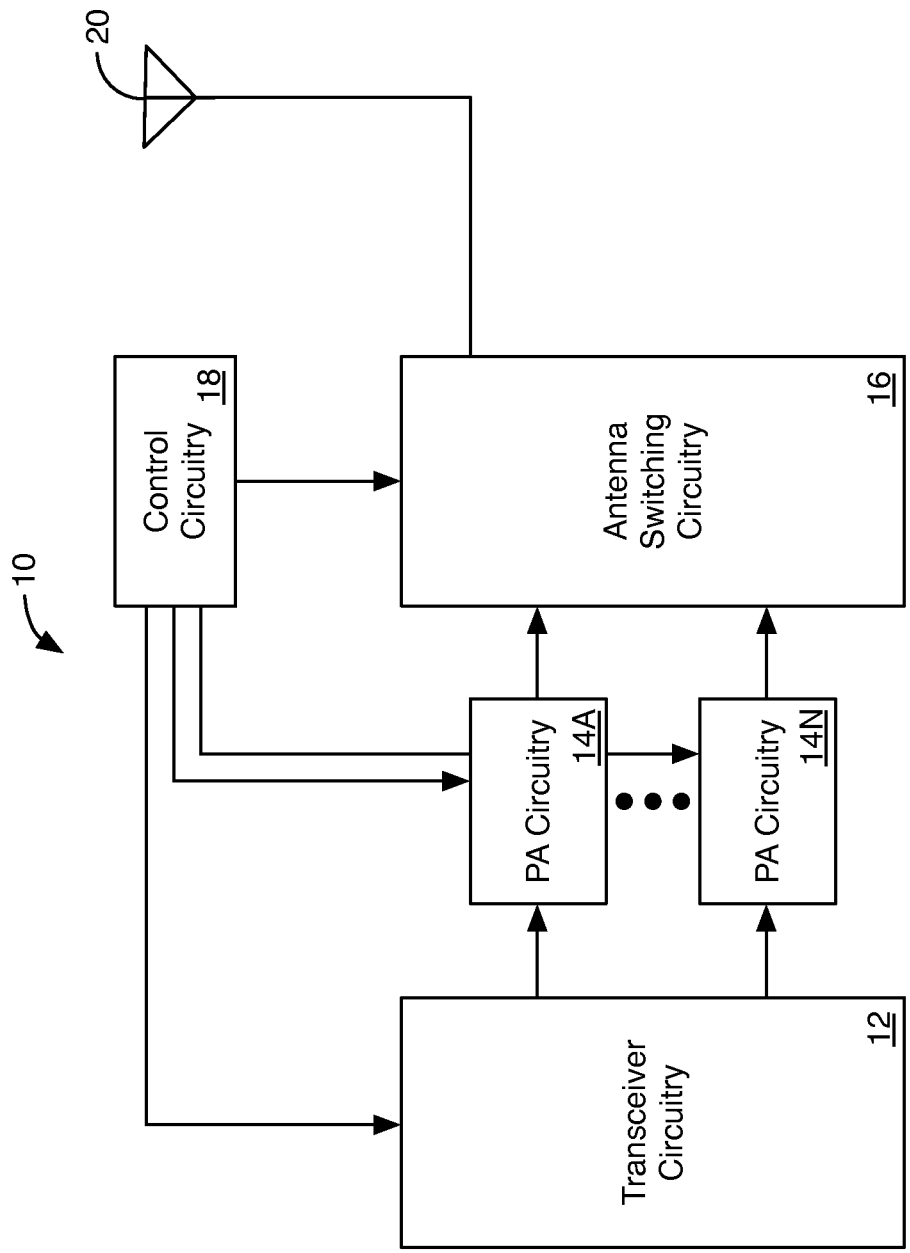
FIG. 1 is a block diagram of a conventional transmit chain for use in a mobile terminal.
Figure 2:
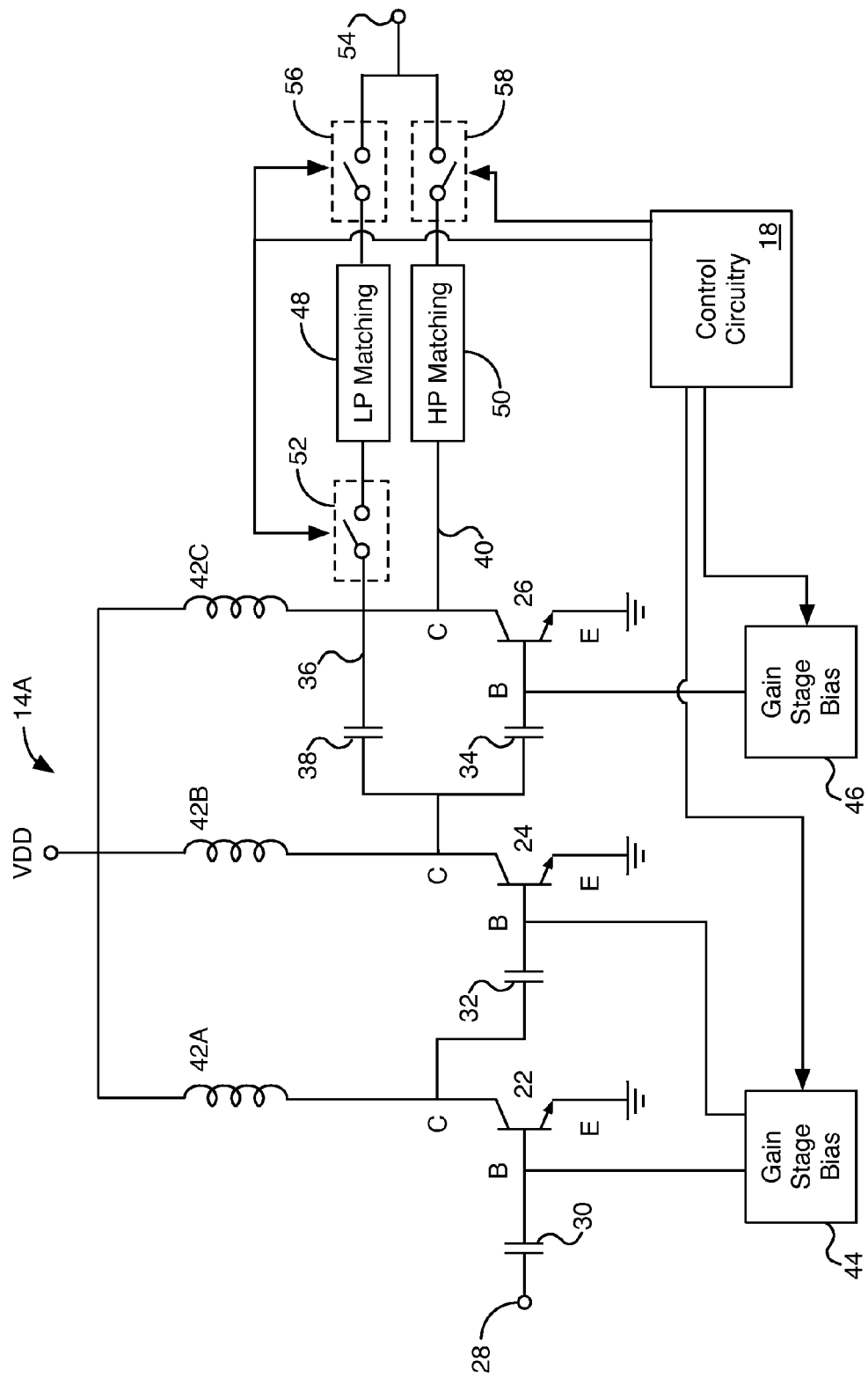
FIG. 2 is a schematic representation of a conventional RF power amplifier used in the conventional transmit chain shown in FIG. 1.
Figure 3:
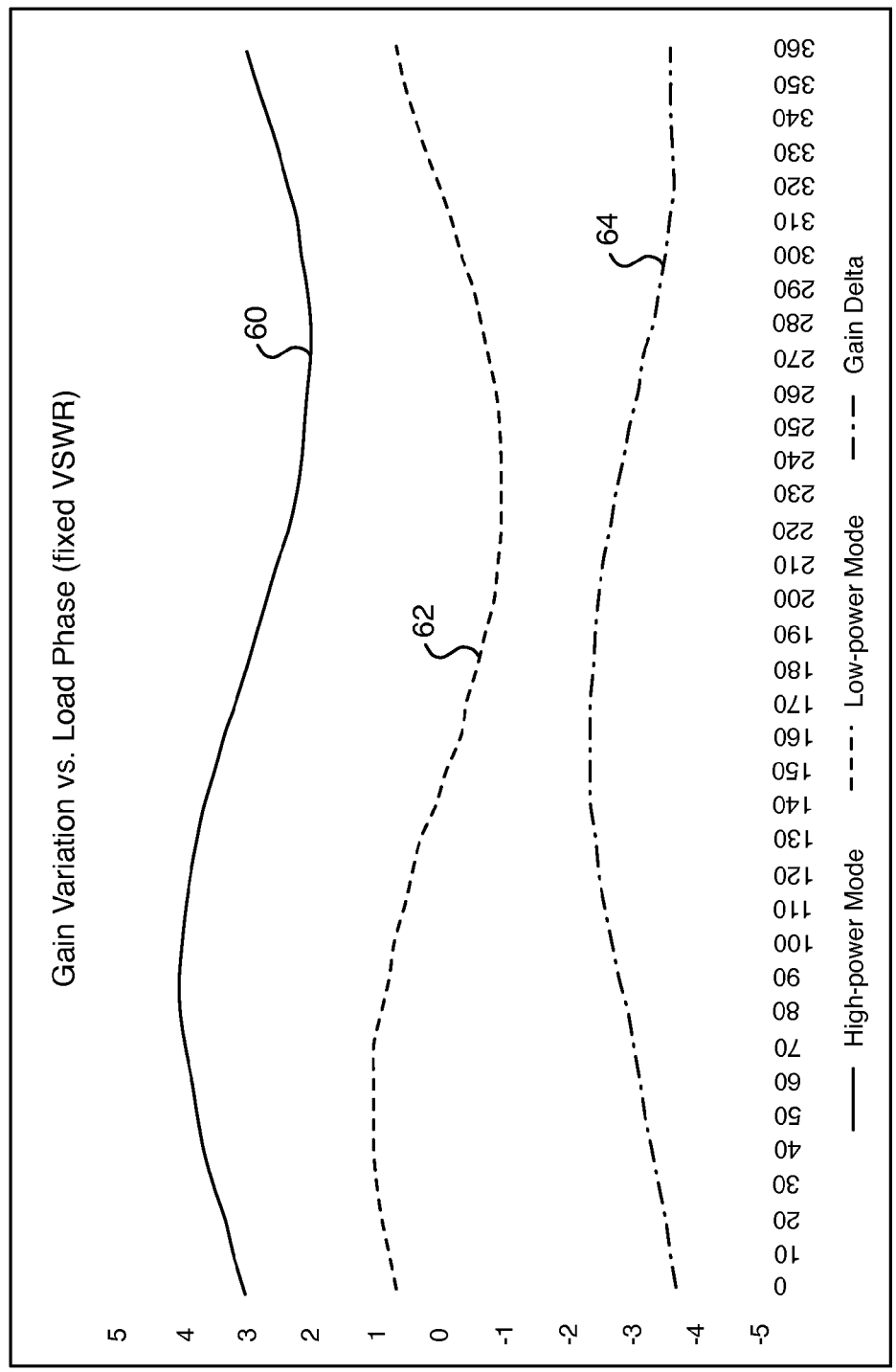
FIG. 3 is a graph depicting the gain response of the conventional RF power amplifier shown in FIG. 2 in a high-power mode of operation and a low-power mode of operation.
Figure 4:
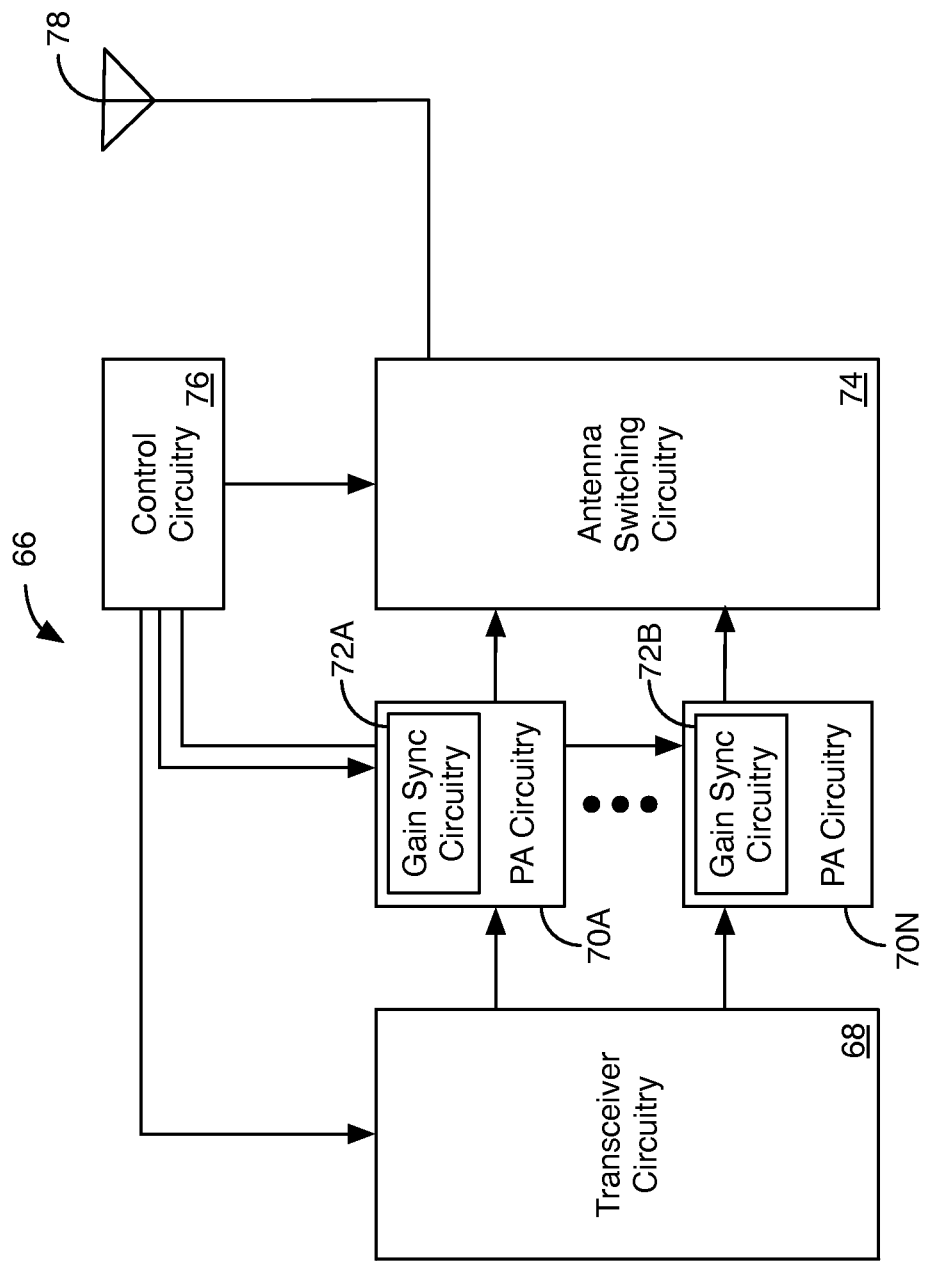
FIG. 4 is a block diagram of a transmit chain for use in a mobile terminal according to one embodiment of the present disclosure.

Turning now to FIG. 4, a radio frequency (RF) transmit chain 66 for a mobile device is shown according to one embodiment of the present disclosure. The RF transmit chain includes transceiver circuitry 68, one or more RF power amplifiers 70A-70N (referred to collectively as the power amplifiers 70) including one or more gain synchronization circuits 72A-72N (referred to collectively as the gain synchronization circuits 72), antenna switching circuitry 74, control circuitry 76, and an antenna 78. Each one of the RF power amplifiers 70 is coupled between the transceiver circuitry 68 and the antenna switching circuitry 74. The control circuitry 76 is coupled to the transceiver circuitry 68, one or more of the RF power amplifiers 70, one or more of the gain synchronization circuits 72, and the antenna switching circuitry 74. The antenna 78 is coupled to the antenna switching circuitry 74, such that the antenna switching circuitry 74 is used to select one of the RF power amplifiers 70 to couple to the antenna 78.

In operation, the transceiver circuitry 68 receives digitized data, which may represent voice, data, or control information. The encoded data is modulated to produce a carrier signal at a desired transmit frequency. The carrier signal is then delivered to one or more of the RF power amplifiers 70, where it is amplified and delivered to the antenna switching circuitry 74. The gain synchronization circuits 72 in each one of the RF power amplifiers 70 synchronize the gain response of each one of the RF power amplifiers 70, such that each one of the RF power amplifiers 70 has a continuous gain response when switching between a high-power mode of operation and low-power mode of operation. The antenna switching circuitry 74 selectively couples one or more output terminals of the RF power amplifiers 70 to the antenna 78 in order to transmit the carrier signal. The control circuitry 76 may control one or more operating parameters of the transceiver circuitry 68, the RF power amplifiers 70, the gain synchronization circuits 72, and the antenna switching circuitry 74.

Figure 5:
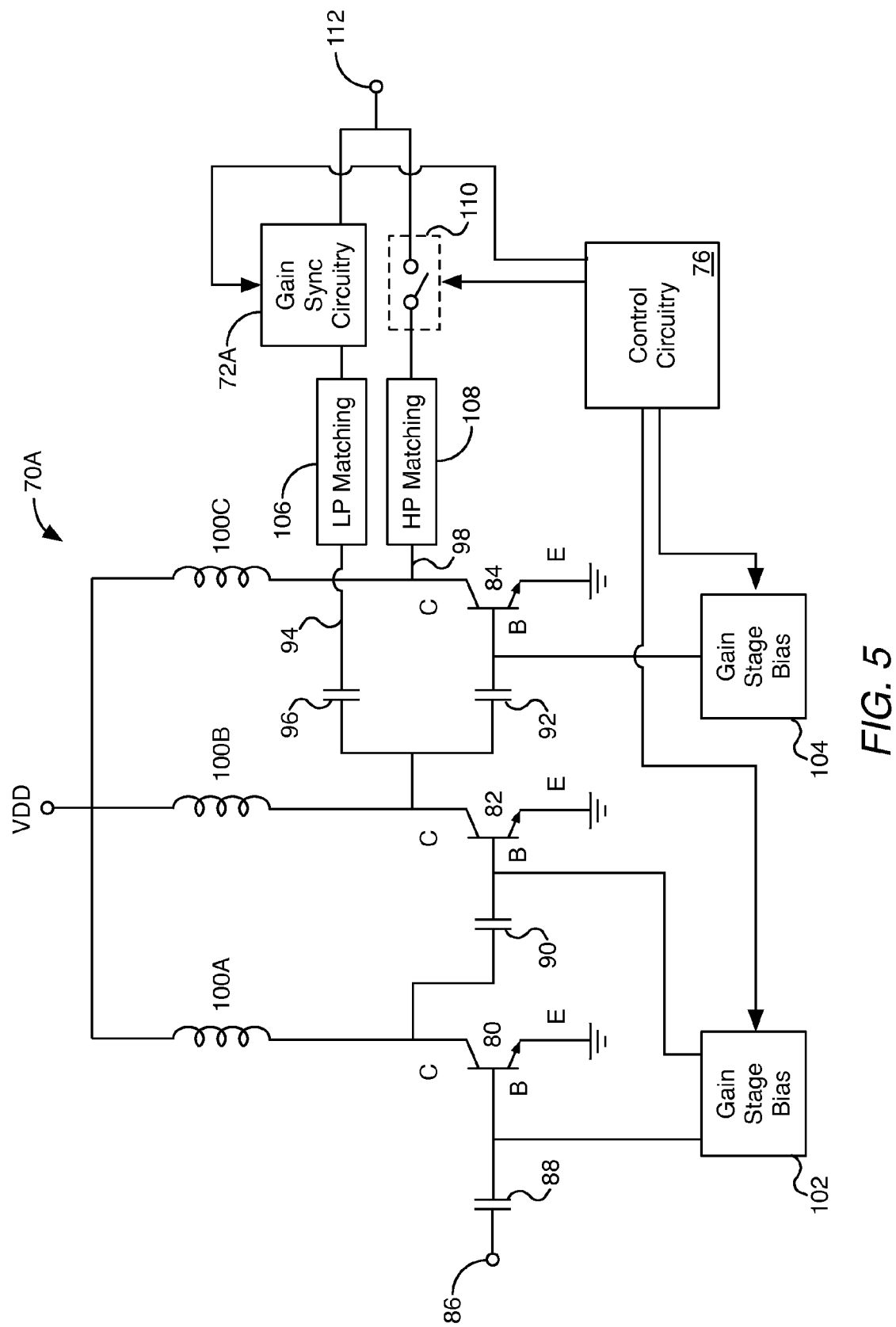
FIG. 5 is a schematic representation of an RF power amplifier including gain synchronization circuitry according to one embodiment of the present disclosure.

FIG. 5 shows details of the first RF power amplifier 70A in the RF transmit chain 66 shown in FIG. 4. For context, control circuitry 76 is also shown. The first RF power amplifier 70A is a multi-stage RF power amplifier including a first gain stage 80, a second gain stage 82, and a third gain stage 84. According to one embodiment, the first gain stage 80, the second gain stage 82, and the third gain stage 84 are bipolar junction transistors (BJTs) including a collector terminal C, an emitter terminal E, and a base terminal B. Those of ordinary skill in the art will appreciate that the principles of the present disclosure can be applied to any amplifier devices, including, but not limited to: field effect transistors (FETs), metal-oxide-semiconductor field-effect transistors (MOSFETs), operational amplifiers, or the like. The base terminal B of the first gain stage 80 is coupled to an input terminal 86 through a first coupling capacitor 88. The collector terminal C of the first gain stage 80 is coupled to the base terminal B of the second gain stage 82 through a second coupling capacitor 90. The emitter terminal E of the first gain stage 80 is coupled to ground.

The collector terminal C of the second gain stage 82 is coupled to the base terminal B of the third gain stage 84 through a third coupling capacitor 92, and also to a low-power amplifier path 94 through a fourth coupling capacitor 96. The emitter terminal E of the second gain stage 82 is coupled to ground. The collector terminal C of the third gain stage 84 is coupled to a high-power amplifier path 98. A supply voltage VDD is provided to the collector terminal C of each one of the first gain stage 80, the second gain stage 82, and the third gain stage 84 through a first choke inductor 100A, a second choke inductor 100B, and a third choke inductor 100C, respectively. First gain stage bias circuitry 102 is coupled to the base terminal B of the first gain stage 80 and the second gain stage 82. Second gain stage bias circuitry 104 is coupled to the base terminal B of the third gain stage 84. The low-power amplifier path 94 includes low-power matching circuitry 106 and the first gain synchronization circuit 72A. The high-power amplifier path 98 includes high-power matching circuitry 108 and a high-power output switch 110. The control circuitry 76 is coupled to the first gain synchronization circuit 72A, the first gain stage bias circuitry 102, the second gain stage bias circuitry 104, and the high-power output switch 110.

Although the first RF power amplifier 70A is shown having three gain stages, those of ordinary skill in the art will appreciate that the principles of the present disclosure can be applied to an RF power amplifier having any number of gain stages.

In operation, the first RF power amplifier 70A receives a signal at the input terminal 86 from the transceiver circuitry (FIG. 4). The signal is passed through the first coupling capacitor 88 to the base terminal B of the first gain stage 80, where it is amplified and presented at the collector terminal C of the first gain stage 80. The amplified signal is then passed through the second coupling capacitor 90 to the base terminal B of the second gain stage 82, where it is further amplified and presented at the collector terminal C of the second gain stage 82. When the first RF power amplifier 70A is in a low-power mode of operation, the amplified signal is delivered to the low-power amplifier path 94 through the fourth coupling capacitor 96. The signal is then passed through the low-power matching circuitry 106 to the first gain synchronization circuit 72A. The first gain synchronization circuit 72A synchronizes the gain response of the low-power amplifier path 94 with that of the high-power amplifier path 98 such that the overall gain response of the first RF power amplifier 70A is continuous even when the load presented at the output terminal 112 of the first RF power amplifier 70A deviates from characteristic impedance of 50Ω. The amplified signal is then delivered to an output terminal 112.

When the first RF power amplifier 70A is in a high-power mode of operation, the amplified signal is delivered from the collector terminal C of the second gain stage 82 to the base terminal B of the third gain stage 84, where it is further amplified and presented at the collector terminal C of the third gain stage 84. The amplified signal is then delivered to the high-power amplifier path 98, where it is passed through the high-power matching circuitry 108 and the high-power output switch 110 to the output terminal 112.

The control circuitry 76 may control one or more operating parameters of the first gain synchronization circuit 72A, the first gain stage bias circuitry 102, the second gain stage bias circuitry 104, and the high-power output switch 110. For example, in the low-power mode of operation of the first RF power amplifier 70A, the control circuitry 76 may operate the first gain stage bias circuitry 102 such that the first gain stage 80 and the second gain stage 82 are placed in an active, or ON stage, and operate the second gain stage bias circuitry 104 such that the third gain stage 84 is placed in an OFF state. Further, in the low-power mode of operation, the control circuitry 76 may open the high-power output switch 110 and close one or more switches in the first gain synchronization circuit 72A in order to direct the amplified signal through the low-power amplifier path 94 to the output terminal 112.

In the high-power mode of operation of the first RF power amplifier 70A, the control circuitry 76 may operate the first gain stage bias circuitry 102 and the second gain stage bias circuitry 104 such that the first gain stage 80, the second gain stage 82, and the third gain stage 84 are placed in an active, or ON stage. Further, in the high-power mode of operation, the control circuitry 76 may open one or more switches in the first gain synchronization circuit 72A and close the high-power output switch 110 in order to direct the amplified signal through the high-power amplifier path 98 to the output terminal 112.

The low-power matching circuitry 106 and the high-power matching circuitry 108 may include active or passive components adapted to match an impedance at the output of the collector terminal C of the second gain stage 82 and the third gain stage 84, respectively, to an impedance presented at the output terminal 112.

By including the first gain synchronization circuit 72A in the low-power amplifier path 94, the gain response of the first RF power amplifier 70A in the low-power mode of operation closely tracks the gain response of the first RF power amplifier 70A in the high-power mode of operation across different loads. Accordingly, the overall gain response of the first RF power amplifier 70A is continuous, thereby allowing the first RF power amplifier 70A to meet standards requirements such that the device can be incorporated into a mobile terminal suitable for distribution and sale.

Although the gain synchronization circuitry is shown in the low-power amplifier path 94, those of ordinary skill in the art will appreciate that the gain synchronization circuitry may be placed in the high-power amplifier path instead, or any other location suitable to provide an overall gain response that is continuous.

Figure 6:
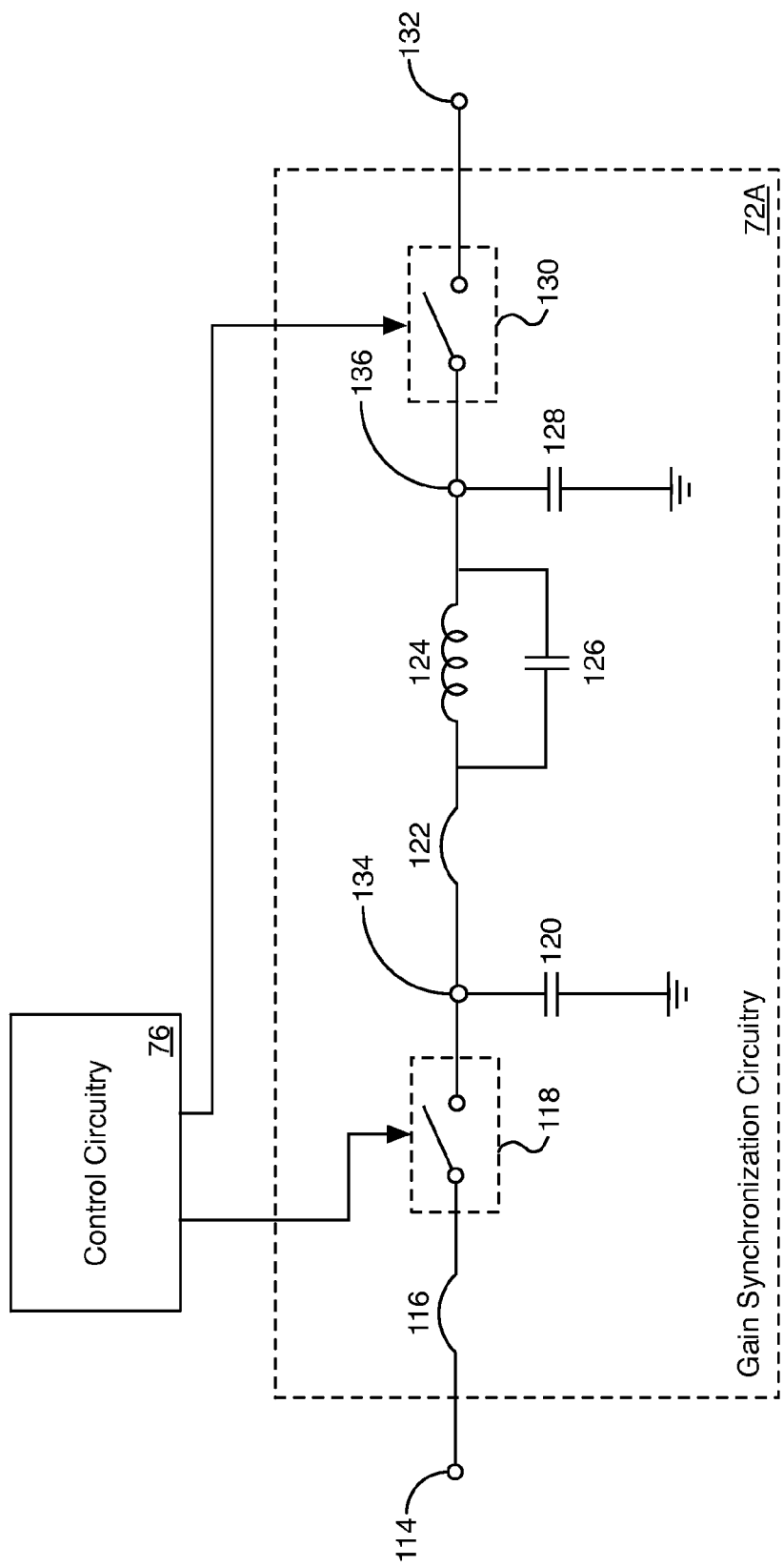
FIG. 6 is a schematic representation of the details of the gain synchronization circuitry shown in FIG. 5 according to one embodiment of the present disclosure.

FIG. 6 shows details of the first gain synchronization circuit 72A according to one embodiment of the present disclosure. The first gain synchronization circuit 72A includes an input terminal 114, a first tuning bond wire 116, a bypass switch 118, a first shunt tuning capacitor 120, a second tuning bond wire 122, a series tuning inductor 124, a series tuning capacitor 126, a second shunt tuning capacitor 128, an output switch 130, and an output terminal 132. The first tuning bond wire 116 is coupled in series with the bypass switch 118, such that the first tuning bond wire 116 and the bypass switch 118 are coupled in series between the input terminal 114 and a first node 134. The first shunt tuning capacitor 120 is coupled between the first node 134 and ground. The second tuning bond wire 122 is coupled in series with the series tuning inductor 124 between the first node 134 and a second node 136. The series tuning inductor 124 is coupled in parallel with the series tuning capacitor 126. The second shunt tuning capacitor 128 is coupled between the second node 136 and ground. The output switch 130 is coupled between the second node 136 and the output terminal 132.

In operation, the first gain synchronization circuit 72A receives an amplified signal at the input terminal 114. The amplified signal is passed through the first tuning bond wire 116, the bypass switch 118, the second tuning bond wire 122, the series tuning inductor 124, the series tuning capacitor 126, and the output switch 130, where the phase, amplitude, or both of the amplified signal may be altered to match a gain response of the high-power amplifier path 98. According to one embodiment, the gain synchronization circuitry adjusts the phase of a signal received at the input terminal to match the phase of an output signal of the high-power amplifier path for any load phase. As will be appreciated by those of ordinary skill in the art, the first gain synchronization circuit 72A may comprise any number of fixed or tunable components in order to alter the phase and/or amplitude of a passing signal without departing from the principles of the present disclosure.

Figure 7:
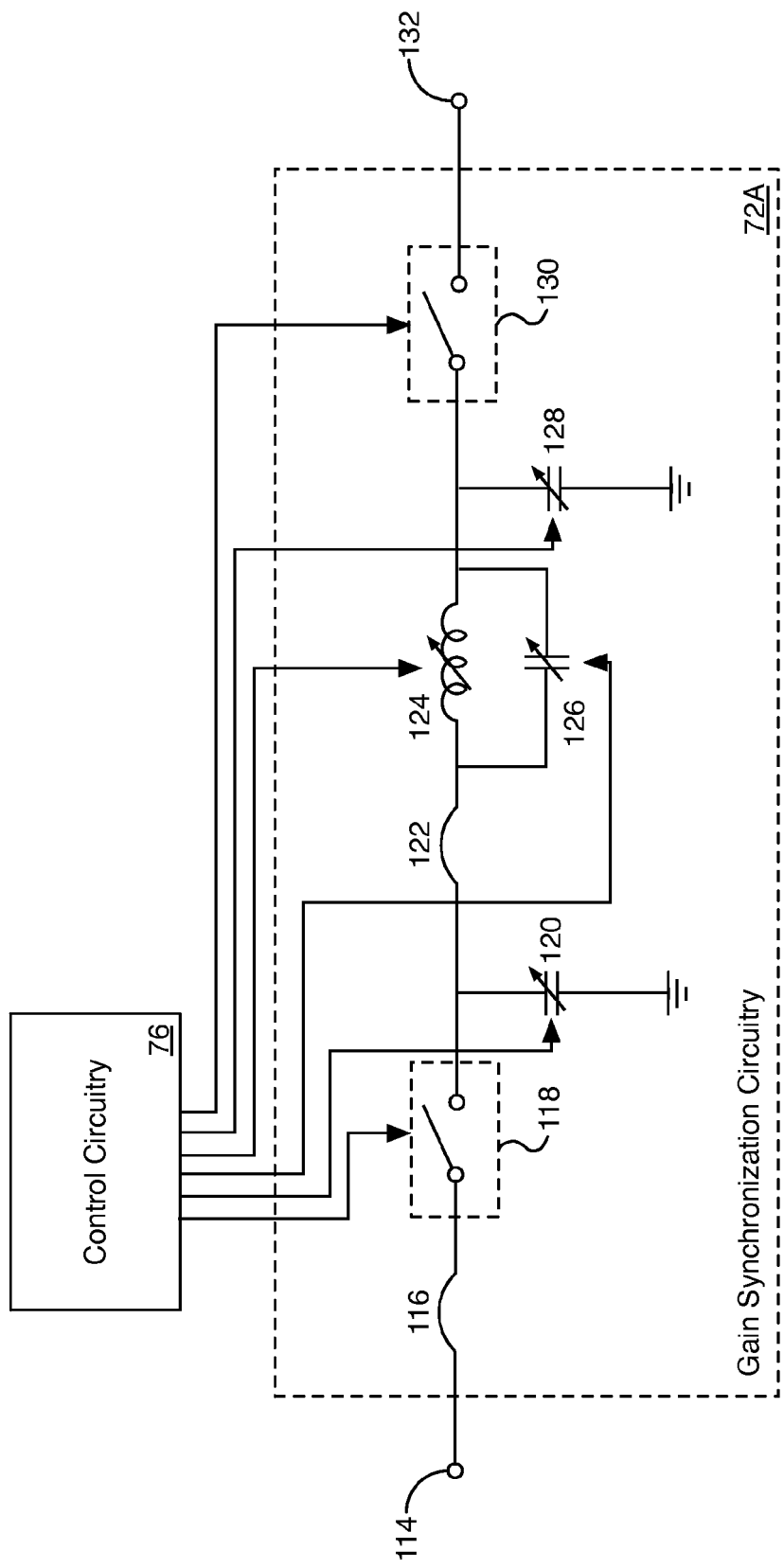
FIG. 7 is a schematic representation of the details of the gain synchronization circuitry shown in FIG. 5 according to an additional embodiment of the present disclosure.

FIG. 7 shows details of the first gain synchronization circuit 72A according to an additional embodiment of the present disclosure. The gain synchronization circuit shown in FIG. 7 is substantially similar to that shown in FIG. 6, except the first shunt tuning capacitor 120, the series tuning inductor 124, the series tuning capacitor 126, and the second shunt tuning capacitor 128 are tunable components controlled by the control circuitry 76. By substituting fixed components for tunable components, the first gain synchronization circuit 72A is able to dynamically adjust the gain response of a connected amplifier over a variety of load operating conditions. Accordingly, the use of tunable components may enable the first gain synchronization circuit 72A to better track the gain of the high-power amplifier path 98.

Figure 8:
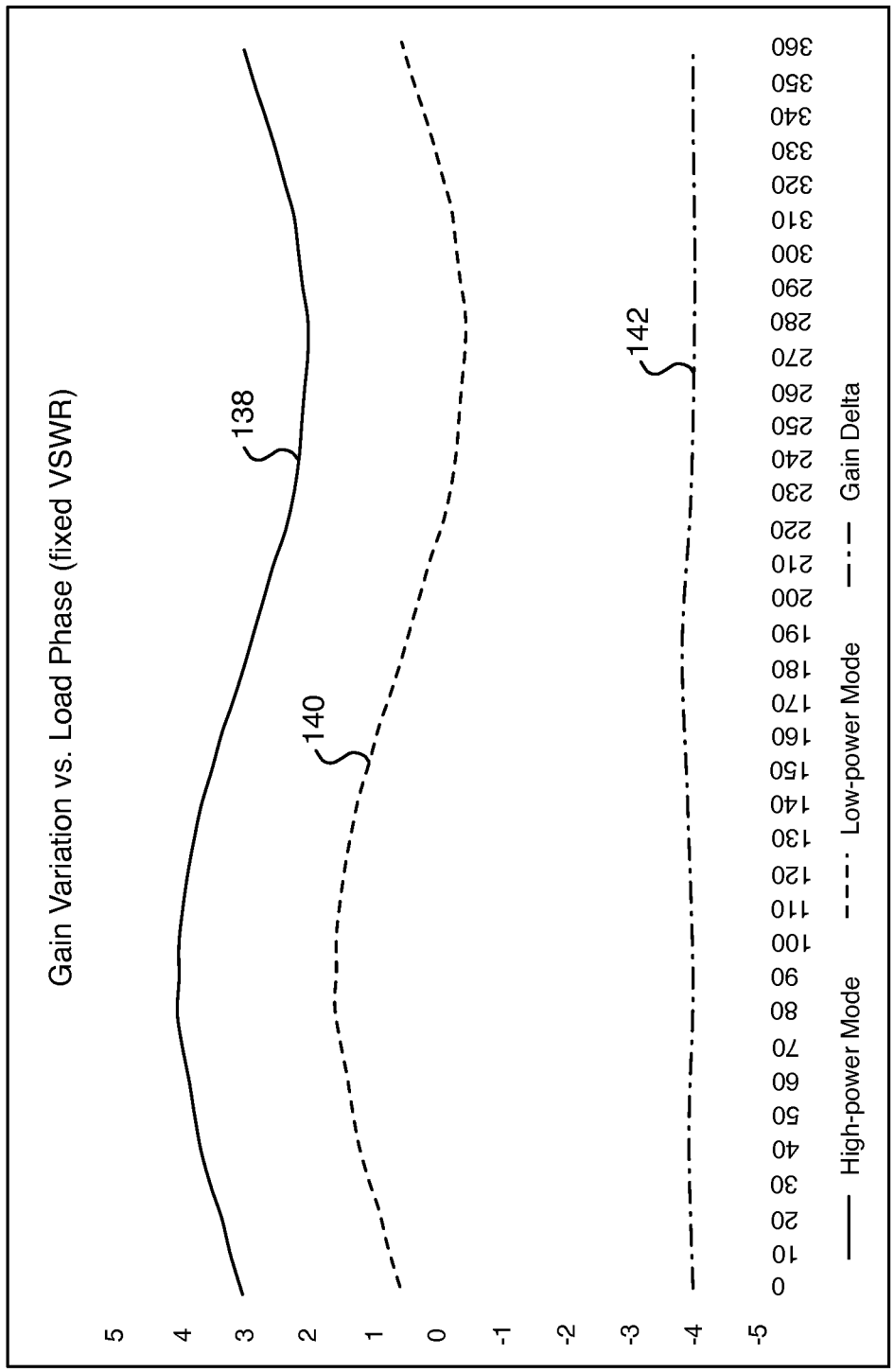
FIG. 8 is a graph depicting the gain response of the RF power amplifier shown in FIG. 5 in a high-power mode of operation and a low-power mode of operation.

FIG. 8 shows a chart depicting the linear gain response of the first RF power amplifier 70A due to the integration of the first gain synchronization circuit 72A. The gain of the first RF power amplifier 70A in the high-power mode of operation with respect to the phase of a load attached to the output terminal 112 is shown by a solid line 138. The gain of the first RF power amplifier 70A in the low-power mode of operation with respect to the phase of a load attached to the output terminal 112 is shown by a dashed line 140. Finally, the gain delta, or difference in the gain response of the first RF power amplifier 70A in the high-power mode of operation and the low-power mode of operation, is shown by a semi-solid line 142. As seen in FIG. 8, the gain response of the first RF power amplifier 70A in the high-power mode of operation is closely tracked by the gain response of the first RF power amplifier 70A in the low-power mode of operation. Accordingly, switching between the high-power mode of operation and the low-power mode of operation will not cause discontinuities in the gain response of the first RF power amplifier 70A across the full dynamic range of desired output power under, even as the load presented to the output terminal 132 of the gain synchronization circuitry 72 deviates from the designed characteristic impedance of 50Ω.

Those skilled in the art will recognize improvements and modifications to the embodiments of the present disclosure. All such improvements and modifications are considered within the scope of the concepts disclosed herein and the claims that follow.

What is claimed is:

1. A multi-stage radio frequency (RF) power amplifier comprising:
    a high-power amplifier path;
    a low-power amplifier path; and
    gain synchronization circuitry in the low-power amplifier path adapted to modify an impedance of the low-power amplifier path such that a gain response of the low-power amplifier path over load phases is synchronized with a gain response of the high-power amplifier path over the load phases, wherein a difference between the gain response of the low-power amplifier path and the gain response of the high-power amplifier path is substantially constant over the load phases.

2. The multi-stage RF power amplifier of claim 1 further comprising:
    a first gain stage including a base terminal coupled to an input terminal, a collector terminal, and an emitter terminal coupled to ground;
    a second gain stage including a base terminal coupled to the collector terminal of the first gain stage, a collector terminal coupled to an output terminal through the low-power amplifier path, and an emitter terminal coupled to ground; and
    a third gain stage including a base terminal coupled to the collector terminal of the second gain stage, a collector terminal coupled to the output terminal through the high-power amplifier path, and an emitter terminal coupled to ground.

3. The multi-stage RF power amplifier of claim 2 further comprising control circuitry adapted to:
    in a low-power mode of operation of the multi-stage RF power amplifier:
        placing the first gain stage and the second gain stage in an ON state, while placing the third gain stage in an OFF state; and
        directing a signal placed at the input terminal to the output terminal through the low-power amplifier path;
    in a high-power mode of operation of the multi-stage RF power amplifier:
        placing the first gain stage, the second gain stage, and the third gain stage in an ON state; and
        directing a signal placed at the input terminal to the output terminal through the high-power amplifier path.

4. The multi-stage RF power amplifier of claim 2 further comprising:
    a first coupling capacitor between the input terminal and the base terminal of the first gain stage;
    a second coupling capacitor between the collector terminal of the first gain stage and the base terminal of the second gain stage;
    a third coupling capacitor between the collector terminal of the second gain stage and the base terminal of the third gain stage; and
    a fourth coupling capacitor between the collector terminal of the second gain stage and the low-power amplifier path.

5. The multi-stage RF power amplifier of claim 2 further comprising:
    first gain stage biasing circuitry adapted to apply a biasing signal to the base terminal of the first gain stage and the second gain stage; and
    second gain stage biasing circuitry adapted to apply a biasing signal to the base terminal of the third gain stage.

6. The multi-stage RF power amplifier of claim 2 further comprising:
    a first choke inductor coupled between the collector terminal of the first gain stage and a supply voltage;
    a second choke inductor coupled between the collector terminal of the second gain stage and the supply voltage; and
    a third choke inductor coupled between the collector terminal of the third gain stage and the supply voltage.

7. The multi-stage RF power amplifier of claim 1 wherein the gain synchronization circuitry comprises:
    an input terminal;
    a first tuning bond wire including a first terminal coupled to the input terminal and a second terminal;
    a bypass switch including a first terminal coupled to the second terminal of the first tuning bond wire and a second terminal coupled to a first node;
    a first shunt tuning capacitor coupled between the second terminal of the bypass switch and ground;
    a second tuning bond wire including a first terminal coupled to the second terminal of the bypass switch and a second terminal;
    a series tuning inductor including a first terminal coupled to the second terminal of the second tuning bond wire and a second terminal;
    a series tuning capacitor coupled in parallel with the series tuning inductor;
    a second shunt tuning capacitor coupled between the second terminal of the series tuning inductor and ground;
    an output switch including a first terminal coupled to the second terminal of the series tuning inductor and a second terminal; and
    an output terminal coupled to the second terminal of the output switch.

8. The multi-stage RF power amplifier of claim 7 further comprising control circuitry adapted to:

in a low-power mode of operation of the multi-stage RF power amplifier:
    close the bypass switch and the output switch; and
in a high-power mode of operation of the multi-stage RF power amplifier:
    open the bypass switch and the output switch.

9. The multi-stage RF power amplifier of claim 7 wherein the first shunt tuning capacitor, the series tuning inductor, the series tuning capacitor, and the second shunt tuning capacitor are tunable.

10. The multi-stage RF power amplifier of claim 9 further comprising control circuitry adapted to:
    in a low-power mode of operation of the multi-stage RF power amplifier:
        close the bypass switch and the output switch; and
        adjust one or more impedance values of the first shunt tuning capacitor, the series tuning inductor, the series tuning capacitor, and the second shunt tuning capacitor such that the phase of an output signal from the low-power amplifier path matches the phase of an output signal from the high-power amplifier path; and
    in a high-power mode of operation of the multi-stage RF power amplifier:
        open the bypass switch and the output switch.

11. The multi-stage RF power amplifier of claim 7 further comprising:
    a first gain stage including a base terminal coupled to an input terminal, a collector terminal, and an emitter terminal coupled to ground;
    a second gain stage including a base terminal coupled to the collector terminal of the first gain stage, a collector terminal coupled to the low-power amplifier path, and an emitter terminal coupled to ground; and
    a third gain stage including a base terminal coupled to the collector terminal of the second gain stage, a collector terminal coupled to the high-power amplifier path, and an emitter terminal coupled to ground.

12. The multi-stage RF power amplifier of claim 11 further comprising control circuitry adapted to:
    in a low-power mode of operation of the multi-stage RF power amplifier:
        placing the first gain stage and the second gain stage in an ON state, while placing the third gain stage in an OFF state; and
        directing a signal placed at the input terminal to the low-power amplifier path by closing the bypass switch and the output switch in the gain synchronization circuitry;
    in a high-power mode of operation of the multi-stage RF power amplifier:
        placing the first gain stage, the second gain stage, and the third gain stage in an ON state; and
        directing a signal placed at the input terminal to the high-power amplifier path by opening the bypass switch and the output switch in the gain synchronization circuitry and closing a high-power output switch in the high-power amplifier path.

13. A multi-stage radio frequency (RF) power amplifier comprising:
    a high-power amplifier path;
    a low-power amplifier path; and
    gain synchronization circuitry in the high-power amplifier path adapted to modify an impedance of the high-power amplifier path such that a gain response of the high-power amplifier path over load phases is synchronized with a gain response of the low-power amplifier path over the load phases, wherein a difference between the gain response of the high-power amplifier path and the gain response of the low-power amplifier path is substantially constant over the load phases.

14. The multi-stage RF power amplifier of claim 13 further comprising:
    a first gain stage including a base terminal coupled to an input terminal, a collector terminal, and an emitter terminal coupled to ground;
    a second gain stage including a base terminal coupled to the collector terminal of the first gain stage, a collector terminal coupled to an output terminal through the low-power amplifier path, and an emitter terminal coupled to ground; and
    a third gain stage including a base terminal coupled to the collector terminal of the second gain stage, a collector terminal coupled to the output terminal through the high-power amplifier path, and an emitter terminal coupled to ground.

15. The multi-stage RF power amplifier of claim 14 further comprising control circuitry adapted to:
    in a low-power mode of operation of the multi-stage RF power amplifier:
        placing the first gain stage and the second gain stage in an ON state, while placing the third gain stage in an OFF state; and
        directing a signal placed at the input terminal to the output terminal through the low-power amplifier path;
    in a high-power mode of operation of the multi-stage RF power amplifier:
        placing the first gain stage, the second gain stage, and the third gain stage in an ON state; and
        directing a signal placed at the input terminal to the output terminal through the high-power amplifier path.

16. The multi-stage RF power amplifier of claim 14 further comprising:
    a first coupling capacitor between the input terminal and the base terminal of the first gain stage;
    a second coupling capacitor between the collector terminal of the first gain stage and the base terminal of the second gain stage;
    a third coupling capacitor between the collector of the second gain stage and the base terminal of the third gain stage; and
    a fourth coupling capacitor between the collector of the second gain stage and the low-power amplifier path.

17. The multi-stage RF power amplifier of claim 14 further comprising:
    first gain stage biasing circuitry adapted to apply a biasing signal to the base terminal of the first gain stage and the second gain stage; and
    second gain stage biasing circuitry adapted to apply a biasing signal to the base terminal of the third gain stage.

18. The multi-stage RF power amplifier of claim 14 further comprising:
    a first choke inductor coupled between the collector terminal of the first gain stage and a supply voltage;
    a second choke inductor coupled between the collector terminal of the second gain stage and the supply voltage; and
    a third choke inductor coupled between the collector terminal of the third gain stage and the supply voltage.

19. The multi-stage RF power amplifier of claim 13 wherein the gain synchronization circuitry comprises:
    an input terminal;

a first tuning bond wire including a first terminal coupled to the input terminal and a second terminal;
a bypass switch including a first terminal coupled to the second terminal of the first tuning bond wire and a second terminal coupled to a first node;
a first shunt tuning capacitor coupled between the second terminal of the bypass switch and ground;
a second tuning bond wire including a first terminal coupled to the second terminal of the bypass switch and a second terminal;
a series tuning inductor including a first terminal coupled to the second terminal of the second tuning bond wire and a second terminal;
a series tuning capacitor coupled in parallel with the series tuning inductor;
a second shunt tuning capacitor coupled between the second terminal of the series tuning inductor and ground;
an output switch including a first terminal coupled to the second terminal of the series tuning inductor and a second terminal; and
an output terminal coupled to the second terminal of the output switch.

20. The multi-stage RF power amplifier of claim 19 further comprising control circuitry adapted to:
in a high-power mode of operation of the multi-stage RF power amplifier:
close the bypass switch and the output switch; and
in a low-power mode of operation of the multi-stage RF power amplifier:
open the bypass switch and the output switch.

21. The multi-stage RF power amplifier of claim 19 wherein the first shunt tuning capacitor, the series tuning inductor, the series tuning capacitor, and the second shunt tuning capacitor of the gain synchronization circuitry are tunable.

22. The multi-stage RF power amplifier of claim 21 further comprising control circuitry adapted to:
in a high-power mode of operation of the multi-stage RF power amplifier:
close the bypass switch and the output switch; and
adjust one or more impedance values of the first shunt tuning capacitor, the series tuning inductor, the series tuning capacitor, and the second shunt tuning capacitor such that the phase of an output signal from the high-power amplifier path matches the phase of an output signal from the low-power amplifier path; and
in a low-power mode of operation of the at least one multi-stage RF power amplifier:
open the bypass switch and the output switch.

23. The multi-stage RF power amplifier of claim 19 further comprising:
a first gain stage including a base terminal coupled to an input terminal, a collector terminal, and an emitter terminal coupled to ground;
a second gain stage including a base terminal coupled to the collector terminal of the first gain stage, a collector terminal coupled to the low-power amplifier path, and an emitter terminal coupled to ground; and
a third gain stage including a base terminal coupled to the collector terminal of the second gain stage, a collector terminal coupled to the high-power amplifier path, and an emitter terminal coupled to ground.

24. The multi-stage RF power amplifier of claim 23 further comprising control circuitry adapted to:
in a low-power mode of operation of the multi-stage RF power amplifier:
placing the first gain stage and the second gain stage in an ON state, while placing the third gain stage in an OFF state; and
directing a signal placed at the input terminal to the low-power amplifier path by opening the bypass switch and the output switch in the gain synchronization circuitry and closing a low-power output switch in the low-power amplifier path;
in a high-power mode of operation of the multi-stage RF power amplifier:
placing the first gain stage, the second gain stage, and the third gain stage in an ON state; and
directing a signal placed at the input terminal to the high-power amplifier path by closing the bypass switch and the output switch in the gain synchronization circuitry.

* * * * *